United States Patent
Cai et al.

(10) Patent No.: US 9,000,537 B2
(45) Date of Patent: Apr. 7, 2015

(54) FINFET DEVICES HAVING RECESSED LINER MATERIALS TO DEFINE DIFFERENT FIN HEIGHTS

(71) Applicants: Globalfoundries Inc., Grand Cayman (KY); International Business Machines Corporation, Armonk, NY (US)

(72) Inventors: Xiuyu Cai, Niskayuna, NY (US); Ruilong Xie, Niskayuna, NY (US); Kangguo Cheng, Schenectady, NY (US); Ali Khakifirooz, Mountain View, CA (US)

(73) Assignees: GLOBALFOUNDRIES Inc., Grand Cayman (KY); International Business Machines Corporation, Armonk, NY (US)

(*) Notice: Subject to any disclaimer, the term of this patent is extended or adjusted under 35 U.S.C. 154(b) by 0 days.

(21) Appl. No.: 14/333,683

(22) Filed: Jul. 17, 2014

(65) Prior Publication Data

US 2014/0327089 A1    Nov. 6, 2014

Related U.S. Application Data

(62) Division of application No. 13/736,294, filed on Jan. 8, 2013, now Pat. No. 8,835,262.

(51) Int. Cl.
- H01L 27/02 (2006.01)
- H01L 29/78 (2006.01)
- H01L 29/66 (2006.01)

(52) U.S. Cl.
CPC ...... *H01L 27/0207* (2013.01); *H01L 29/66477* (2013.01); *H01L 29/78* (2013.01); *H01L 29/785* (2013.01)

(58) Field of Classification Search
USPC .......... 257/327, 401, E21.442; 438/283, 284, 438/287
See application file for complete search history.

(56) References Cited

U.S. PATENT DOCUMENTS

| | | | |
|---|---|---|---|
| 6,642,090 B1 | 11/2003 | Fried et al. |
| 7,413,943 B2 | 8/2008 | Kim et al. |
| 7,902,035 B2 | 3/2011 | Yu et al. |
| 8,039,326 B2 | 10/2011 | Knorr et al. |
| 2005/0167754 A1 | 8/2005 | Kang et al. |
| 2005/0170593 A1 | 8/2005 | Kang et al. |
| 2006/0022262 A1 | 2/2006 | Yoon et al. |

(Continued)

OTHER PUBLICATIONS

Office Acton from related U.S. Appl. No. 14/333,135 dated Jan. 20, 2015.

*Primary Examiner* — Daniel Shook
(74) *Attorney, Agent, or Firm* — Amerson Law Firm, PLLC

(57) ABSTRACT

One method includes performing an etching process through a patterned mask layer to form trenches in a substrate that defines first and second fins, forming liner material adjacent the first fin to a first thickness, forming liner material adjacent the second fin to a second thickness different from the first thickness, forming insulating material in the trenches adjacent the liner materials and above the mask layer, performing a process operation to remove portions of the layer of insulating material and to expose portions of the liner materials, performing another etching process to remove portions of the liner materials and the mask layer to expose the first fin to a first height and the second fin to a second height different from the first height, performing another etching process to define a reduced-thickness layer of insulating material, and forming a gate structure around a portion of the first and second fin.

17 Claims, 5 Drawing Sheets

(56) References Cited

U.S. PATENT DOCUMENTS

2010/0151640 A1* 6/2010 Huebinger et al. ........... 438/221
2010/0213539 A1 8/2010 Masuoka et al.
2010/0230757 A1 9/2010 Chen et al.
2011/0045648 A1 2/2011 Knorr et al.
2011/0260250 A1* 10/2011 Miller et al. .................. 257/347

* cited by examiner

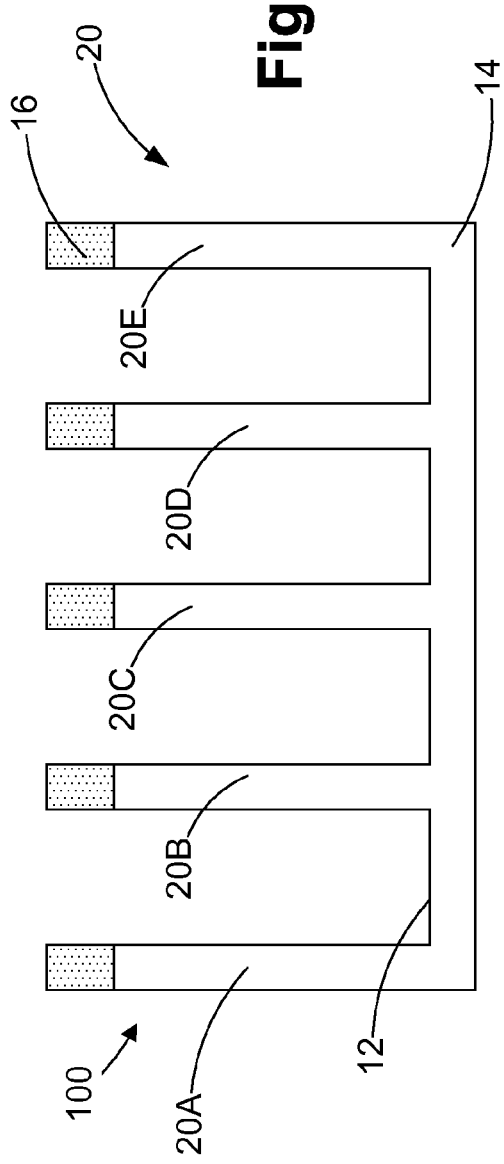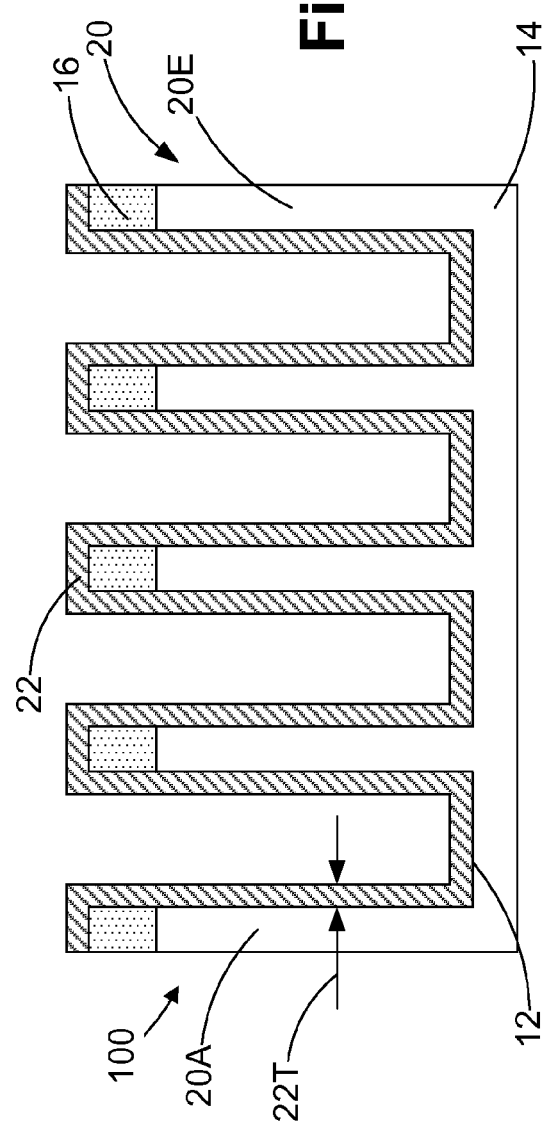

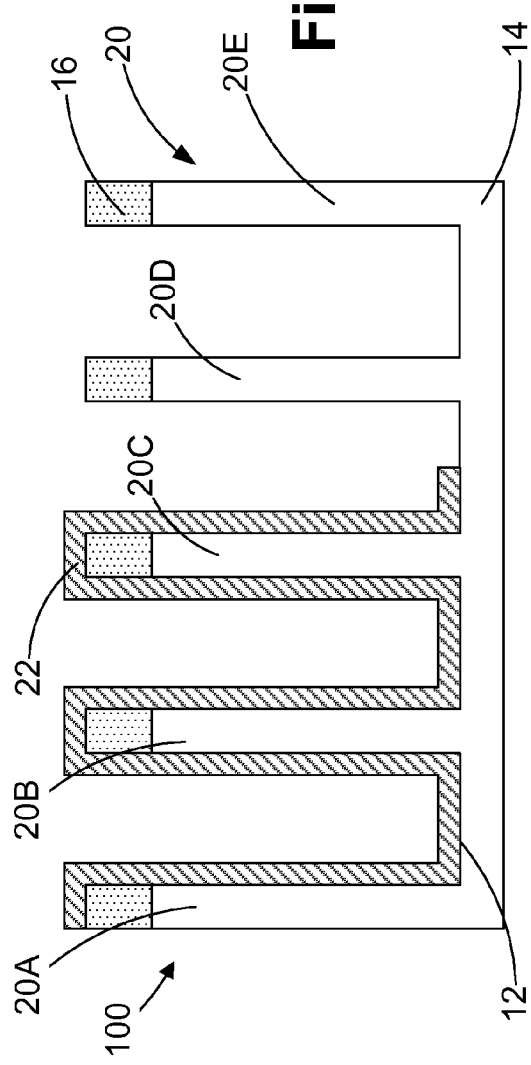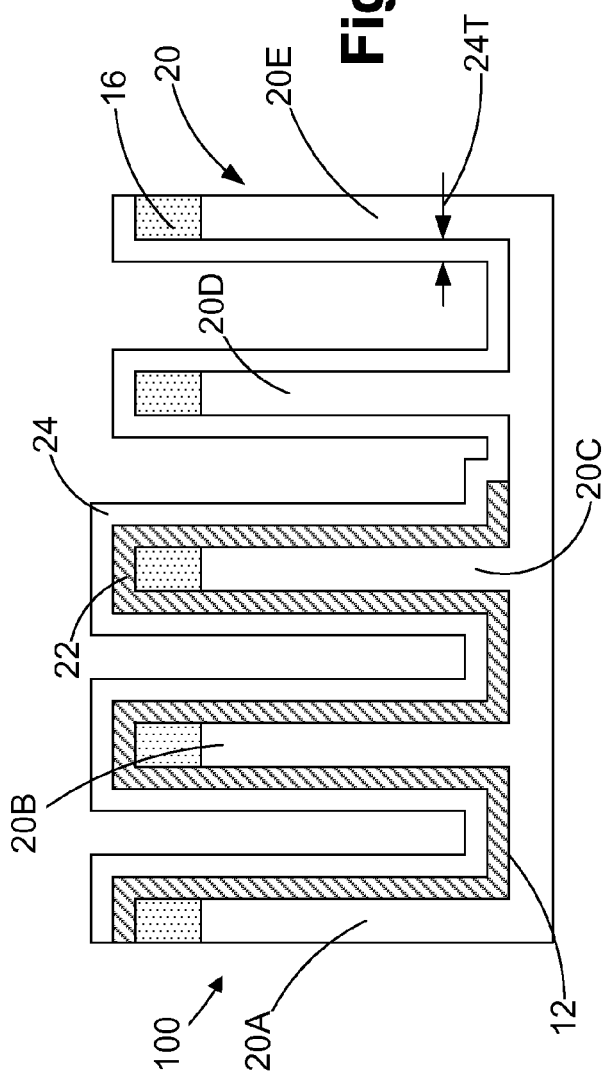

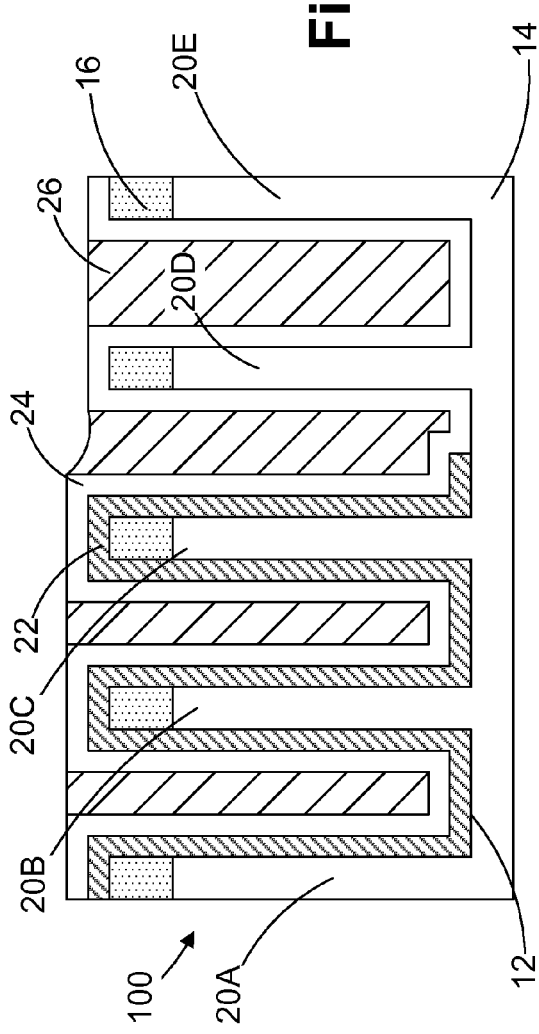
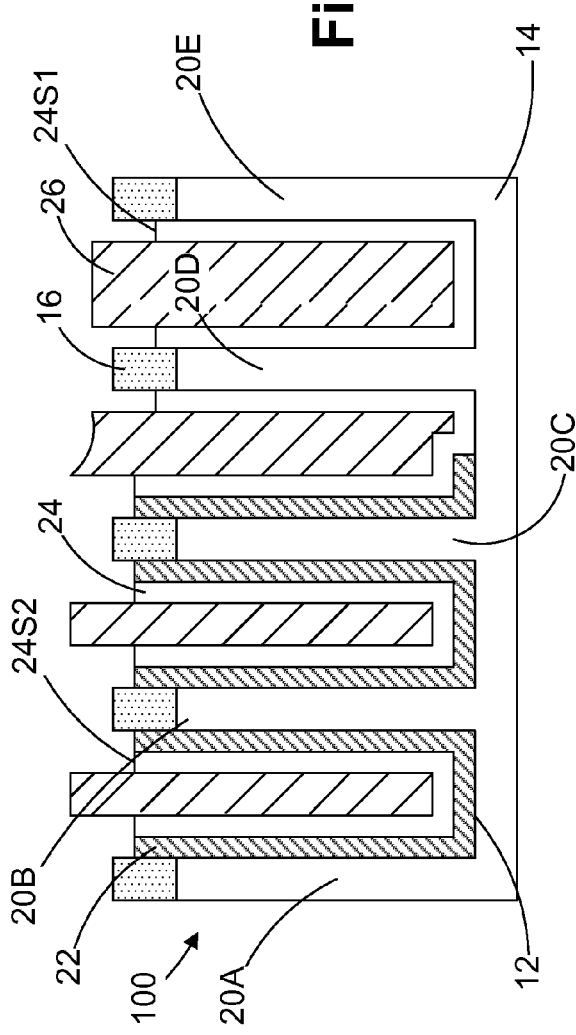

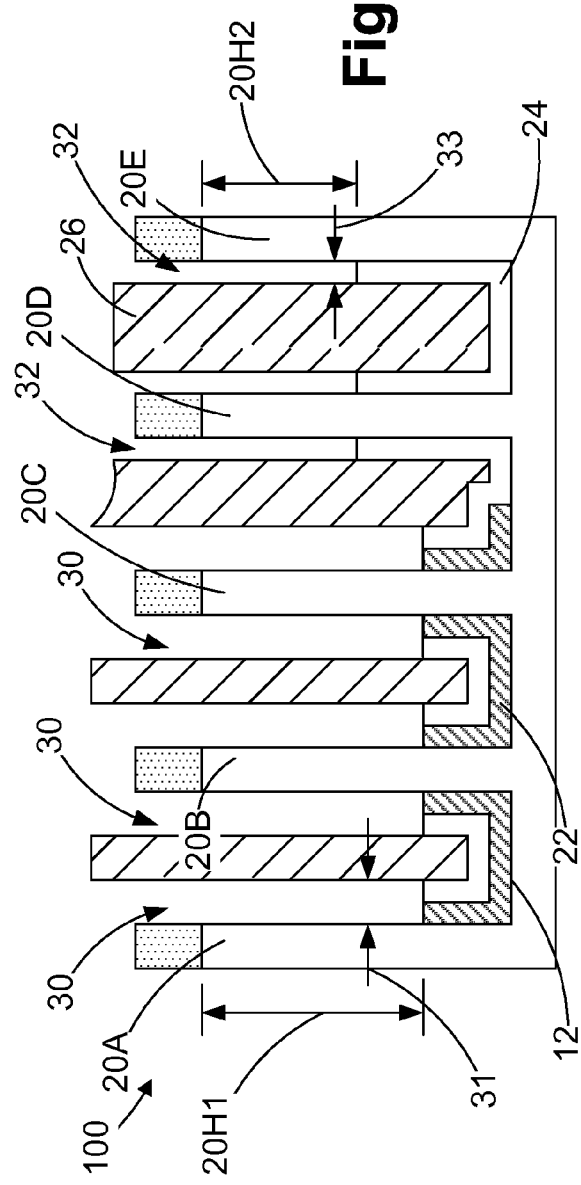
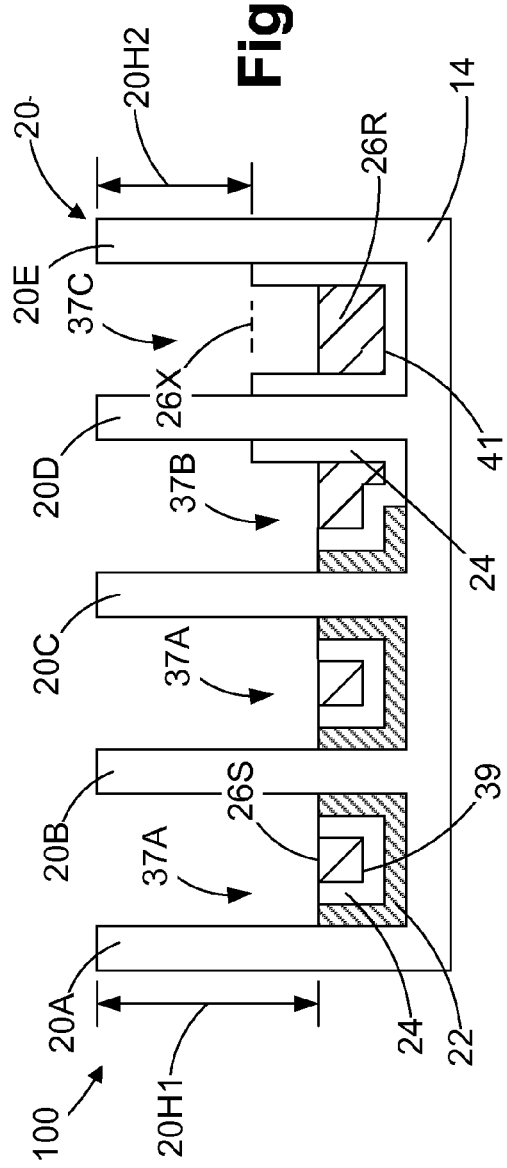

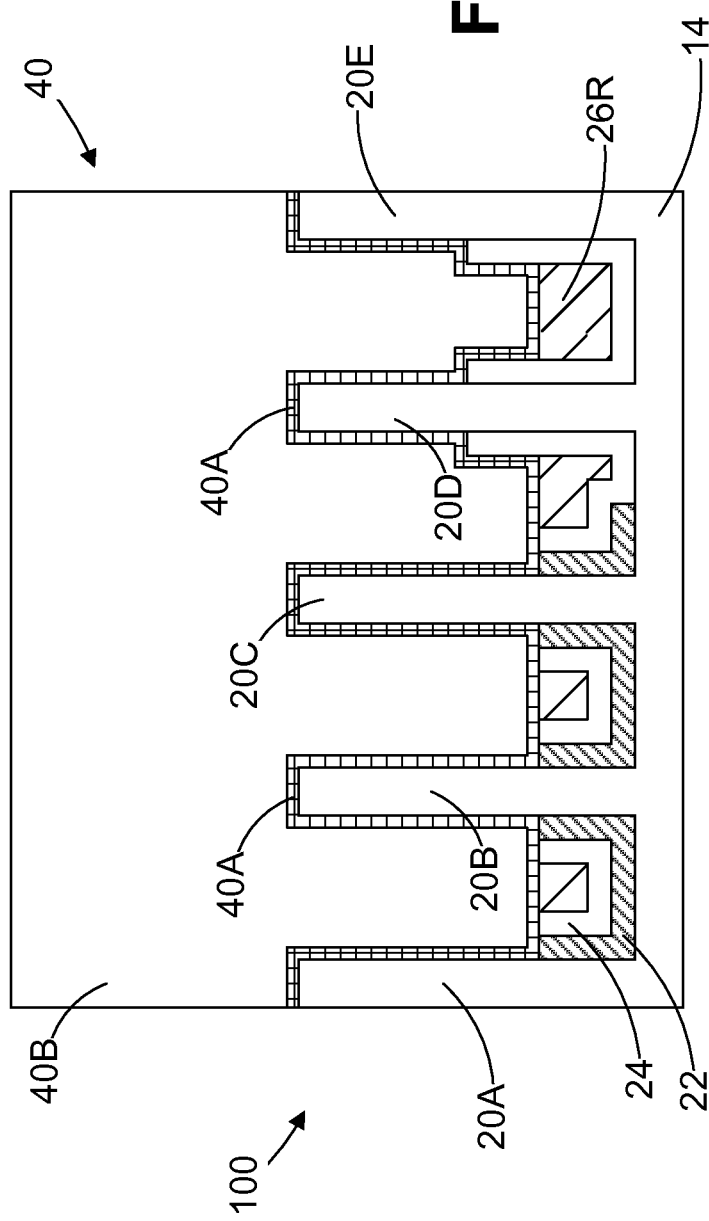

FINFET DEVICES HAVING RECESSED LINER MATERIALS TO DEFINE DIFFERENT FIN HEIGHTS

CROSS-REFERENCE TO RELATED APPLICATION

This is a divisional of co-pending application Ser. No. 13/736,294, filed Jan. 8, 2013.

BACKGROUND OF THE INVENTION

1. Field of the Invention

Generally, the present disclosure relates to the manufacture of sophisticated semiconductor devices, and, more specifically, to various methods of forming 3D semiconductor devices, such as FinFET devices, by performing a recessing process on liner materials to define fins for the FinFET device that have different fin heights, and to a FinFET device that includes such recessed liner materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

One process flow that is typically performed to form FinFET devices involves forming a plurality of trenches in the substrate to define the areas where STI regions will be formed and to define the initial structure of the fins. These trenches are typically formed in the substrate during the same process operation for processing simplicity. The trenches have a target depth that is sufficient for the needed fin height and deep enough to allow formation of an effective STI region. After the trenches are formed, a layer of insulating material, such as silicon dioxide, is formed so as to overfill the trenches. Thereafter, a chemical mechanical polishing (CMP) process is then performed to planarize the upper surface of the insulating material with the top of the fins (or the top of a patterned hard mask). Thereafter, an etch-back process is performed to recess the layer of insulating material between the fins and thereby expose the upper portions of the fins, which corresponds to the final fin height of the fins.

Given the way that fins are typically formed, a conventional FinFET device has a fixed fin height, i.e., all of the fins have the same height. Thus, the total channel width of a multiple fin FinFET device is equal to the number of fins ("X") times the channel width provided by each fin, i.e., each fin provides a channel length equal to two times (2×) the vertical fin-height plus the width of the top surface of the fin. That is, the total channel width of a multiple fin device is fixed by the fin height and number of fins. Importantly, using traditional manufacturing techniques, a FinFET device with multiple fins, e.g., a two-fin device, cannot be manufactured such that the total channel width of the device is equal to, for example, 1.5 times the total height of the two fins in the two-fin device. This lack of flexibility in manufacturing FinFET devices provides designers with less flexibility that would otherwise be desired in designing complex integrated circuits.

Device manufacturers are under constant pressure to produce integrated circuit products with increased performance and lower production cost relative to previous device generations. Thus, device designers spend a great amount of time in an effort to maximize device performance while seeking ways to reduce manufacturing cost and improve manufacturing reliability. As it relates to 3D devices, device designers have spent many years and employed a variety of techniques in an effort to improve the performance capability and reliability of such devices.

The present disclosure is directed to various methods of forming 3D semiconductor devices, such as FinFET devices, by performing a recessing process on liner materials to define fins for the FinFET device that have different fin heights, and to a FinFET device that includes such recessed liner materials, that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming 3D semiconductor devices, such as Fin-FET devices, by performing a recessing process on liner materials to define fins for the FinFET device that have different fin heights, and to a FinFET device that includes such recessed liner materials. In one example, the method disclosed herein includes performing at least one first etching process through a patterned mask layer to form a plurality of trenches in a substrate that defines at least first and second fins, forming liner material adjacent to at least the first fin to a first thickness, forming liner material adjacent to the second fin to a second thickness that is different from the first thickness, forming insulating material in the trenches adjacent the liner materials and above the mask layer, performing at least one process operation to remove portions of the layer of insulating material and to expose portions of the liner materials, performing at least one second etching process to remove portions of the liner materials and the mask layer so as to expose the first fin to a first height and the second fin to a second height that is different from the first height, performing at least one third etching process on the insulating material to thereby define a reduced-thickness layer of insulating material and forming a gate structure around a portion of the first fin and the second fin.

One illustrative FinFET device disclosed herein includes a plurality of trenches formed in a semiconducting substrate that define at least a first fin having a first height and a second fin having a second height, wherein the first and second heights are different, a first local isolation region positioned in a bottom of each of a plurality of trenches that define the first fin, wherein the first local isolation region comprises a first generally U-shaped liner material having a plurality of spaced-apart generally upstanding vertically oriented legs that define, in part, a first cavity, the legs of the first generally U-shaped liner material having a first thickness, a second local isolation region positioned in a bottom of each of a plurality of trenches that define the second fin, wherein the second local isolation region comprises a second generally U-shaped liner material having a plurality of spaced-apart generally upstanding vertically oriented legs that define, in part, a second cavity, the legs of the second generally U-shaped liner material having a second thickness that is different than the first thickness, a layer of insulating material positioned at least partially in the first and second cavities and a gate structure positioned around a portion of the first and second fins.

BRIEF DESCRIPTION OF THE DRAWINGS

The disclosure may be understood by reference to the following description taken in conjunction with the accompanying drawings, in which like reference numerals identify like elements, and in which:

FIGS. 1A-1I depict various illustrative methods of forming FinFET devices by performing a recessing process on liner materials to define fins for the FinFET device that have different fin heights, and to a FinFET device that includes such recessed liner materials.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to various methods of forming 3D semiconductor devices, such as Fin-FET devices, by performing a recessing process on liner materials to define fins for the FinFET device that have different fin heights, and to a FinFET device that includes such recessed liner materials. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 1A schematically depicts the novel FinFET device 100 disclosed herein at a point of fabrication wherein a plurality of trenches 12 have been formed in a bulk semiconducting substrate 14 by performing at least one etching process through a patterned hard mask layer 16, e.g., a patterned layer of silicon nitride. This results in the formation of a plurality of illustrative fins 20. The FinFET device 100 may be either an N-type device or a P-type FinFET device, and it may be formed using either so-called "gate-first" or "replacement gate" ("gate-last") techniques. In the examples depicted herein, the illustrative FinFET device 100 will be comprised of five illustrative fins 20, i.e., fins 20A-E. However, as will be recognized by those skilled in the art after a complete reading of the present application, the presently disclosed inventions may be employed in manufacturing FinFET devices having two or more fins.

The substrate 14 may have a variety of configurations, such as the depicted bulk substrate configuration. The substrate 14 may be made of silicon or it may be made of materials other than silicon. Thus, the terms "substrate" or "semiconducting substrate" should be understood to cover all semiconducting materials and all forms of such materials. Additionally, the overall size, shape and configuration of the trenches 12 and fins 20 may vary depending on the particular application. The depth and width of the trenches 12 may also vary depending upon the particular application. In one illustrative embodiment, based on current day technology, the depth of the trenches 12 may range from approximately 30-200 nm and the width of the trenches 12 may range from about 20-50 nm. In some embodiments, the fins 20 may have a width within the range of about 5-30 nm. In the illustrative examples depicted in most of the attached drawings, the trenches 12 and fins 20 are all of a uniform size and shape. However, as discussed more fully below, such uniformity in the size and shape of the trenches 12 and the fins 20 is not required to practice at least some aspects of the inventions disclosed herein. In the attached figures, the trenches 12 are depicted as having been formed by performing an anisotropic etching process that results in the trenches 12 having a schematically depicted, generally rectangular configuration. In an actual real-world device, the sidewalls of the trenches 12 may be somewhat inwardly tapered, although that configuration is not depicted in most of the attached drawings. In some cases, the trenches 12 may have a reentrant profile near the bottom of the trenches 12. To the extent the trenches 12 are formed by performing a wet etching process, the trenches 12 may tend to have a more rounded configuration or non-linear configuration as compared to the generally rectangular configuration of the trenches 12 that are formed by performing an anisotropic etching process. Thus, the size and configuration of the trenches 12, and the manner in which they are made, as well as the general configuration of the fins 20, should not be considered a limitation of the present invention. For ease of disclosure, only the substantially rectangular trenches 12 will be depicted in the subsequent drawings.

The patterned hard mask layer 16 is intended to be representative in nature as it may be comprised of a variety of materials, such as, for example, silicon nitride, silicon oxynitride, $Al_2O_3$, $HfO_2$, etc. Moreover, the patterned hard mask layer 16 may be comprised of multiple layers of material. The patterned hard mask layer 16 may be formed by depositing the layer(s) of material that comprise the patterned hard mask layer 16 and thereafter directly patterning the patterned hard mask layer 16 using known photolithography and etching techniques. Alternatively, the patterned hard mask layer 16 may be formed by using known sidewall image transfer techniques. Thus, the particular form and composition of the patterned hard mask layer 16 and the manner in which it is made should not be considered a limitation of the present invention. In the case where the patterned hard mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

FIG. 1B depicts the FinFET device 100 after a conformal deposition process, e.g., a chemical vapor deposition (CVD) process, an atomic layer deposition (ALD) process, etc., has been performed to form a first liner layer 22 on the fins 20 and in the trenches 12. More specifically, in the depicted example, the first liner layer 22 is formed above the patterned hard mask layer 16, on the sidewalls of all of the fins 20 and in the trenches 12. The thickness 22T of the first liner layer 22 may vary depending upon the particular application, e.g., it may have a thickness of about 2-5 nm. As described more fully below, using the processes described herein, the fin height of at least some of the fins 20 of the FinFET device 100 are set, based in part, by selecting the desired thickness 22T of the first liner layer 22. In general, the first liner layer 22 may be made of a material that may be selectively etched relative to the insulating material that will be used to fill the portions of the trenches 12 in a later process operation. For example, the first liner layer 22 may be comprised of silicon nitride, silicon carbon nitride, silicon boron nitride, a doped nitride, silicon oxynitride, $Al_2O_3$, $HfO_2$, boron or phosphorous doped silicon dioxide, etc. The basic principle involved is that the liner layer 22 needs to be selectively etchable relative to the hard mask 16 and the insulating material that will ultimately be formed to fill the remaining portions of the trenches 12 in a subsequent process operation to be more fully described below. In one particularly illustrative embodiment, the patterned hard mask layer 16 may be made of silicon nitride and the first liner layer 22 may be made of aluminum oxide.

FIG. 1C depicts the FinFET device 100 after several process operations have been performed. First, a patterned masking layer (not shown), e.g., a patterned photoresist mask, was formed that covered portions of the first liner layer 22 and exposed other portions of the first liner layer 22, i.e., the portions above the fins 20D-E, for further processing. Thereafter, an etching process was performed through the patterned mask layer to remove the exposed portions of the first liner layer 22. Thereafter, the masking layer was removed. Such processing operations result in the structure depicted in FIG. 1C. Importantly, this etching process clears the liner material from the sidewalls of the fins 20D-E.

FIG. 1D depicts the FinFET device 100 after another conformal deposition process, e.g., a chemical vapor deposition (CVD) process, an atomic layer deposition (ALD) process, etc., has been performed to form a second liner layer 24 above the remaining portion of the first liner layer 22 on the fins 20A-C and in the trenches 12 adjacent the exposed fins 20D-E. The thickness 24T of the second liner layer 24 may vary depending upon the particular application, e.g., it may have a thickness of about 2-5 nm. In some cases, the thickness 24T of the second liner layer 24 may be about the same as the thickness 22T (FIG. 1B) of the first liner layer 22, although such a situation is not required to practice the inventions disclosed herein. As described more fully below, using the processes described herein, the fin height of at least some of the fins 20A-C are set, based, in part, upon the combined thicknesses 22T, 24T of the first and second liner layers 22, 24, respectively, while the fin height of the fins 20D-E are set, based, in part, upon the thickness 24T of only the second liner layer 24. In general, the second liner layer 24 may be made of a material that may be selectively etched relative to the insulating material that will be used to fill the portions of the trenches 12 in a later process operation. For example, the second liner layer 24 may be comprised of silicon nitride, silicon carbon nitride, silicon boron nitride, a doped nitride, silicon oxynitride, $Al_2O_3$, $HfO_2$, boron or phosphorous doped silicon dioxide, etc. In some cases, the first liner layer 22 and the second liner layer 24 may be made of the same material, although such a situation is not required to practice the inventions disclosed herein. In one particularly illustrative embodiment, the patterned hard mask layer 16 may be made of silicon nitride, while the first liner layer 22 and the second liner layer 24 may both be made of aluminum oxide.

FIG. 1E depicts the FinFET device 100 after several process operations have been performed. First, a layer of insulating material 26 was deposited so as to overfill the trenches 12 and, thereafter, a CMP process was performed on the layer of insulating material 26 in an effort to planarize the upper surface of the layer of insulating material 26. Due to the presence of the first liner layer 22 and the second liner layer 24 above the fins 20A-C, there may be some dishing of the layer of insulating material 26 in the area above the fin 20D, as depicted in FIG. 1E. In the depicted example, the CMP process stops on the second liner layer 24. The layer of insulating material 26 may be comprised of a variety of different materials, such as silicon dioxide, doped silicon dioxide (doped with carbon, boron or phosphorous), etc., and it may be formed by performing a variety of techniques, e.g., chemical vapor deposition (CVD), etc. Instead of a CMP process, an etch-back process could be performed on the layer of insulating material 26 to arrive at substantially the same structure as depicted in FIG. 1E.

FIGS. 1F-1G depict an etching process sequence that is performed on the FinFET device 100. Initially, if desired, an optional oxide deglaze etching process may be performed to insure that all of the insulating material 26, e.g., silicon dioxide, is removed from the upper surfaces of the second liner layer 24. In general, the etching process sequence is performed to remove the patterned hard mask 16 and portions of the first and second liner layers 22, 24 selectively relative to the insulating material 26. Initially, as shown in FIG. 1F, during a first portion of the etching sequence, portions of the first and second liner layers 22, 24 are removed to expose the patterned hard mask layer 16. Depending upon the material of construction of the patterned hard mask 16, and the first and second liner layers 22, 24, some of the patterned hard mask layer 16 may be consumed at the point of fabrication depicted in FIG. 1F, although such consumption in not depicted in the drawings. At this point in the etching sequence, portions of the liner materials, i.e., the liners 22 and/or 24 positioned in the trenches 12, are exposed. Due to the presence of the second liner layer 24 above the fins 20A-C, after this initial portion of the etching sequence, the surface 24S1 of the second liner layer 24 in the area around the fins 20D-E is at a level that is below the surface 24S2 of the second liner layer 24 in the area around the fins 20A-C.

FIG. 1G depicts the FinFET device 100 at the end of the etching process sequence wherein the first and second liner layers 22, 24 have been recessed sufficiently to establish the final exposed first fin height 20H1 for the fins 20A-C and a second exposed fin height 20H2 for the fins 20D-E, wherein the first fin height 20H1 is greater than the second fin height 20H2. In the depicted example, the etching process sequence results in cavities 30 adjacent the fins 20A-C and cavities 32 adjacent the fins 20D-E. The liner material(s) in the trenches 12 adjacent the fins 20A-C has a thickness 31 that is greater than the thickness 33 of the liner material(s) in the trenches 12 adjacent the fins 20D-E. In general, in forming the cavities 30, 32, the etch rate of the liner materials (liner 22 and/or 24 as the case may be) in the above-described liner material recessing etch process increases as the width of the cavities 30, 32 increases, which provides a means to effectively control the depth of the liner recess. That is, due to the greater width 31 of the liner material(s) in the cavities 30 as compared to the width 33 of the liner material(s) in the cavities 32, the depth of the cavities 30 will be greater than the depth of the cavities 32, which provides an effective means to control the final fin heights 20H1, 20H2 of the fins 20 in the FinFET device 100. The difference in the effective etch rate of the etch process in the cavities 30, 32 occupied by the liner materials of different thicknesses may be referred to as a so-called capillary effect. It should also be noted that the control of the fin heights 20H1, 20H2 is not dependent upon the fin pitch of FinFET devices located in different regions of an integrated circuit product, since the fin heights 20H1, 20H2 are based upon applying the above-described capillary effects when to remove the liner material(s), irrespective of fin pitch. Stated another way, the greater the thickness of the liner material in the trenches adjacent a particular fin, the greater will be the final fin height of the fin using the methods disclosed herein. The increased width due to additional liner material means that the cavity 30 during the recess etch process is wider, which does not slow the etch rate of the recess etch process as much as a narrower cavity 32 that results from the use of a thinner liner material(s), e.g., only the second liner layer 24. By selecting the appropriate target thickness 22T (FIG. 1B) and/or 24T (FIG. 1D) (either a specific number or a range) of the first and second liner layers 22, 24, the target final fin heights 20H1, 20H2 for the FinFET device 100 may be set and controlled using the methods disclosed herein. For example, using the methods disclosed herein, setting the target thickness 31 of the liner material(s) adjacent the fins 20A-C at values A, B and C results in the fins 20A-C of the FinFET device 100 having a substantially uniform final fin height 20H1 of $X_1$, $X_2$ and $X_3$, respectively. Similarly, using the methods disclosed herein, setting the target thickness 33 of the liner material(s) adjacent the fins 20D-E at values D and E results in the fins 20D-E of the FinFET device 100 having a substantially uniform final fin height 20H2 of $Y_1$ and $Y_2$, respectively. It should also be noted that the control of the fin heights 20H1, 20H2 is not dependent upon the fin pitch of FinFET devices located in different regions of an integrated circuit product, since the fin heights 20H1, 20H2 are based upon applying the above-described capillary effects when to remove the liner material(s), irrespective of fin pitch. The relationship between the thicknesses of the liner materials 31, 33 and the associated final fin heights 20H1, 20H2 may vary depending upon a variety of factors, e.g., the materials used for the liner material(s), the etchants used in the recess etch process, the geometry of the trench 12, etc. Moreover, the relationship between the thicknesses of the liner materials 31, 33 and the final fin heights 20H1, 20H2 may not be linear. Accordingly, it is anticipated that, in implementing the present inventions, testing may be required to establish the exact parameters of, for example, liner material(s), liner thicknesses and etching process conditions and materials to arrive at a solution tailored for a particular FinFET device 100.

FIG. 1H depicts the FinFET device 100 at a point in fabrication wherein a timed etching process has been performed on the layer of insulating material 26 to reduce its thickness and thereby define a reduced-thickness layer of insulating material 26R. This process results in the formation of local isolation regions 37A, 37B and 37C in the bottom of the trenches 12 that have slightly different configurations. The local isolation region 37A is generally comprised of a first generally "U" shaped dual liner configuration with a pair of spaced-apart substantially upstanding or vertical leg portions (the combined vertically oriented portions of the liners 22, 24) that are connected by a substantially horizontal portion (the combined horizontally oriented portions of the liners 22, 24). This first generally U-shaped liner defines a first liner cavity 39. A portion of the layer of insulating material 26R is positioned in the first liner cavity 39 defined. The local isolation region 37C is generally comprised of a second generally "U" shaped single liner configuration with a pair of spaced-apart substantially upstanding or vertical leg portions of the second liner layer 24 that are connected by a substantially horizontal portion of the second liner layer 24. This second generally U-shaped liner defines a second liner cavity 41. A portion of the layer of insulating material 26R is positioned in the second liner cavity 41 defined. The isolation region 37B is somewhat of a combination of the regions 37A, 37C. Importantly, in the isolation region 37B, the portions of the recessed second liner layer 24 defines the final fin height 20H2 for the fin 20D. In any event, the isolation region 37B also has a generally U-shaped configuration wherein a portion of the reduced thickness layer of insulating material is positioned at least partially in the cavity defined by the isolation region 37B.

The process of recessing the layer of insulating material 26 may be accurately controlled such that its post-recessing surface 26S may be positioned at any desired location. In the depicted example, the recessing etch process is performed for a sufficient duration such that the post-recessing surface 26S is positioned substantially even with the upper surfaces of the liner materials of the local isolation regions 37A. In practice, the post-etch surface 26S may be located at the level depicted in FIG. 1H or at a level corresponding to the dashed line 26X in FIG. 1H.

FIG. 1I depicts the FinFET device 100 at a later stage of manufacturing wherein an illustrative final gate structure 40 comprised of an illustrative gate insulation layer 40A and an illustrative gate electrode 40B has been formed on the device 100. The final gate structure 40 may be formed using so-called "gate-first" or "replacement-gate" ("gate-last") techniques. An illustrative gate cap layer (not shown) may also be formed above the illustrative gate electrode 40B. The gate insulation layer 40A may be comprised of a variety of different materials, such as, for example, silicon dioxide, a so-called high-k (k greater than 10) insulation material (where k is the relative dielectric constant), etc. The thickness of the gate insulation layer 40A may also vary depending upon the particular application, e.g., it may have a thickness of about 1-2 nm. Similarly, the gate electrode 40B may also be of a variety of conductive materials, such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations. In one illustrative embodiment, a thermal oxidation process may be performed to form a gate insulation layer 40A comprised of silicon dioxide. Thereafter, the gate electrode material 40B and the gate cap layer material (not shown) may be deposited above the device 100 and the layers may be patterned using known photolithographic and etching techniques. In another illustrative embodiment, a conformal CVD or ALD process may be performed to form the depicted gate insulation layer 40A comprised of hafnium oxide. Thereafter, one or more metal layers (that will become the gate electrode 40B) and a gate cap layer material (not shown), e.g., silicon nitride, may be deposited above the device 100. At this point, traditional manufacturing techniques may be performed to complete the manufacture of the FinFET device 100. For example, sidewall spacers (not shown) comprised of, for example, silicon nitride, may be formed adjacent the final gate structure 40. After the spacers are formed, if desired, an epitaxial growth process may be performed to form additional semiconducting material (not shown) on the portions of the fins 20 positioned outside of the spacers. Additional contacts and metallization layers may then be formed above the FinFET device 100 using traditional techniques.

One illustrative method disclosed herein includes performing at least one first etching process through a patterned mask layer 16 to form a plurality of trenches 12 in the substrate 14 that defines at least a first fin, e.g., fin 20B and at least a second fin, e.g., 20D, forming liner material (e.g., portions of the liners 22 and 24) adjacent to the first fin to a first thickness 31, forming liner material (e.g., portions of the liner 24) adjacent to the second fin to a second thickness 33 that is different from the first thickness, and forming insulating material 26 in the trenches adjacent the liner materials and above the mask layer 16. The method also includes performing at least one process operation to remove portions of the layer of insulating material 26 and to expose portions of the liner materials, performing at least one second etching process to remove portions of the liner materials and the mask layer 16 so as to expose the first fin to a first height 20H1 and the second fin to a second height 20H2 that is different from the first height, performing at least one third etching process on the insulating material to thereby define a reduced-thickness layer of insulating material 26R and forming a gate structure 40 around a portion of the first fin and the second fin.

One illustrative FinFET device disclosed herein includes a plurality of trenches 12 formed in a semiconducting substrate 14 that define at least a first fin, e.g., fin 20B, having a first height 20H1 and a second fin, e.g., 20D, having a second height 20H2, wherein the first and second heights are different, a first local isolation region 37A positioned in a bottom of each of a plurality of trenches that define the first fin, wherein the first local isolation region comprises a first generally U-shaped liner material having a plurality of spaced-apart generally upstanding vertically oriented legs (the vertical portions of the liners 22, 24) that define, in part, a first cavity 39, the legs of the first generally U-shaped liner material having a first thickness 31, a second local isolation region 37C positioned in a bottom of each of a plurality of trenches that define the second fin, wherein the second local isolation region comprises a second generally U-shaped liner material having a plurality of spaced-apart generally upstanding vertically oriented legs that define, in part, a second cavity 41, wherein the legs of the second generally U-shaped liner material having a second thickness 33 that is different than the first thickness, a layer of insulating material 26 positioned at least partially in the first and second cavities, and a gate structure 40 positioned around a portion of the first and second fins.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A FinFET device, comprising;
a plurality of trenches formed in a semiconducting substrate that define at least a first fin and a second fin;
a first local isolation region positioned in a bottom of each of a plurality of trenches that define said first fin, said first local isolation defining a first height of the first fin, said first isolation region comprising a first generally U-shaped liner material having a plurality of spaced apart generally upstanding legs that define, in part, a first cavity, said legs of said first generally U-shaped liner material having a first thickness;
a second local isolation region positioned in a bottom of each of a plurality of trenches that define said second fin, said second local isolation region defining a second fin height, wherein said first and second heights are different, said second local isolation region comprising a second generally U-shaped liner material having a plurality of spaced apart generally upstanding vertically oriented legs that define, in part, a second cavity, said legs of said second generally U-shaped liner material having a second thickness that is different than said first thickness;
a layer of insulating material positioned at least partially in said first and second cavities; and
a gate structure positioned around a portion of said first and second fins.

2. The device of claim 1, wherein said semiconducting substrate is comprised of silicon.

3. The device of claim 1, wherein said layer of insulating material is positioned entirely within one of said cavities.

4. The device of claim 1, wherein said gate structure is comprised of a silicon dioxide gate insulation layer and a polysilicon gate electrode positioned above said gate insulation layer.

5. The device of claim 1, wherein said gate structure is comprised of a gate insulation layer comprised of a high-k insulating material and a gate electrode comprised of at least one layer of metal.

6. The device of claim 1, wherein said trenches have at least one of substantially vertical sidewalls, sloped sidewalls or curved sidewalls.

7. The device of claim 1, wherein said first thickness is greater than said second thickness and said first height is greater than said second height.

8. The device of claim 1, wherein said first thickness is less than said second thickness and said first height is less than said second height.

9. The device of claim 1, wherein said liner material positioned adjacent said first fin comprises multiple layers of liner material, said liner material positioned adjacent said second fin comprises a single layer of liner material, said first thickness is greater than said second thickness and said first height is greater than said second height.

10. The device of claim 1, wherein said liner material positioned adjacent said first fin comprises a single layer of liner material, said liner material positioned adjacent said second fin comprises a single layer of liner material, said first thickness is greater than said second thickness and said first height is greater than said second height.

11. A FinFET device, comprising;
a plurality of trenches formed in a semiconducting substrate that define at least a first fin and a second fin;
a first local isolation region positioned in a bottom of each of a plurality of trenches that define said first fin, said first local isolation region defining a first height of said first fin, said first local isolation region comprising a first generally U-shaped liner layer having a plurality of spaced apart generally upstanding legs that define, in part, a first cavity, each of said legs of said first generally U-shaped liner layer having a first thickness;
a second local isolation region positioned in a bottom of each of a plurality of trenches that define said second fin, said second local isolation region defining a second fin height that is greater than said first fin height, said second local isolation region comprising a second generally U-shaped liner layer positioned on said first generally U-shaped liner layer, said second generally U-shaped liner layer having a plurality of spaced apart generally upstanding oriented legs that define, in part, a second cavity, wherein a combined thickness of the legs of said first and second generally U-shaped liner layers is greater than said first thickness;
a layer of insulating material positioned at least partially in said first and second cavities; and
a gate structure positioned around a portion of said first and second fins.

12. The device of claim 11, wherein said semiconducting substrate is comprised of silicon.

13. The device of claim 11, wherein said layer of insulating material is positioned entirely within one of said cavities.

14. The device of claim 11, wherein said gate structure is comprised of a silicon dioxide gate insulation layer and a polysilicon gate electrode positioned above said gate insulation layer.

15. The device of claim 11, wherein said gate structure is comprised of a gate insulation layer comprised of a high-k insulating material and a gate electrode comprised of at least one layer of metal.

16. The device of claim 11, wherein said trenches have at least one of substantially vertical sidewalls, sloped sidewalls or curved sidewalls.

17. The device of claim 11, wherein said first generally U-shaped liner layer and said second generally U-shaped liner layer are made of the same material.

* * * * *